United States Patent [19]
Nishitani et al.

[11] Patent Number: 5,944,414
[45] Date of Patent: Aug. 31, 1999

[54] CEILING-MOUNTED ELECTRIC COMPONENT ASSEMBLY

[75] Inventors: Keizo Nishitani; Atsuyoshi Yamaguchi; Satoru Unno, all of Shizuoka, Japan

[73] Assignee: Yazaki Corporation, Tokyo, Japan

[21] Appl. No.: 08/956,044

[22] Filed: Oct. 24, 1997

[30] Foreign Application Priority Data

Oct. 25, 1996 [JP] Japan ................................. 8-283951

[51] Int. Cl.⁶ .................................................. B60Q 3/00
[52] U.S. Cl. ........................ 362/490; 362/488; 362/493; 362/365
[58] Field of Search ................................ 362/488, 490, 362/493, 364, 365

[56] References Cited

U.S. PATENT DOCUMENTS 5,091,831  2/1992  Van Order et al. .................... 362/490
5,357,408  10/1994  Leeznar et al. ........................ 362/74

FOREIGN PATENT DOCUMENTS 2-124344  5/1990  Japan .
2-124345  5/1990  Japan .

Primary Examiner—Thomas M. Sember
Attorney, Agent, or Firm—Armstrong, Westerman, Hattori, McLeland & Naughton

[57] ABSTRACT

A ceiling-mounted electric component assembly is provided. A molded ceiling for fastening to a vehicle ceiling is provided with an aperture for mounting therein an electric component. Conductors extend across the electric component mounting aperture. A circuit body receiver plate is provided to cover the mounting aperture. The electric component is mounted on the circuit body receiver plate, with the conductors positioned the former and the latter such that the electric component is electrically connected to at least one of the conductors. An additional circuit body is optionally mountable on the circuit body receiver plate.

The mounting of electric components on the vehicle ceiling is facilitated, and various electric components can be optionally mounted.

10 Claims, 11 Drawing Sheets

CEILING-MOUNTED ELECTRIC COMPONENT ASSEMBLY

BACKGROUND OF THE INVENTION

1. Field of the Invention

This invention relates to a ceiling-mounted electric component assembly consisting of a molded ceiling which is fastened to the ceiling mainly of an automobile body, and various electric components and their electric wires integrally mounted on the molded ceiling.

2. Description of the Related Art

Figure 16:
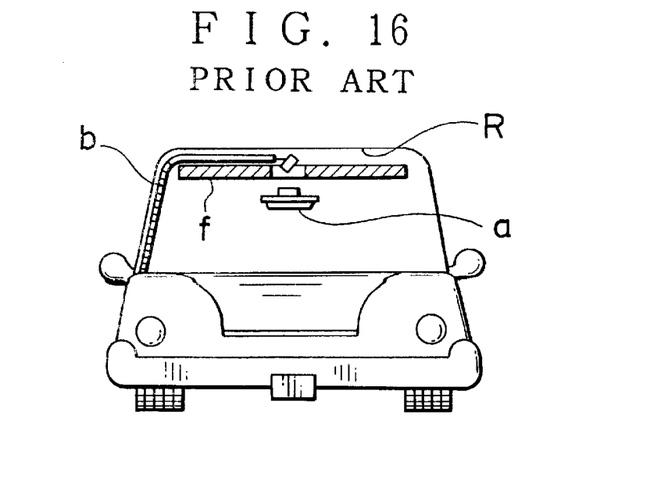
FIG. 16 is an explanatory view of a conventional electric component and roof wiring harness assembled on the ceiling of an automobile.

In general, as shown in FIG. 16, on the ceiling R of a vehicle such as an automobile, there are installed a lighting unit a such as a room lamp unit, spotlight unit or the like and its electric wiring (roof wiring harness) b.

Figure 17:
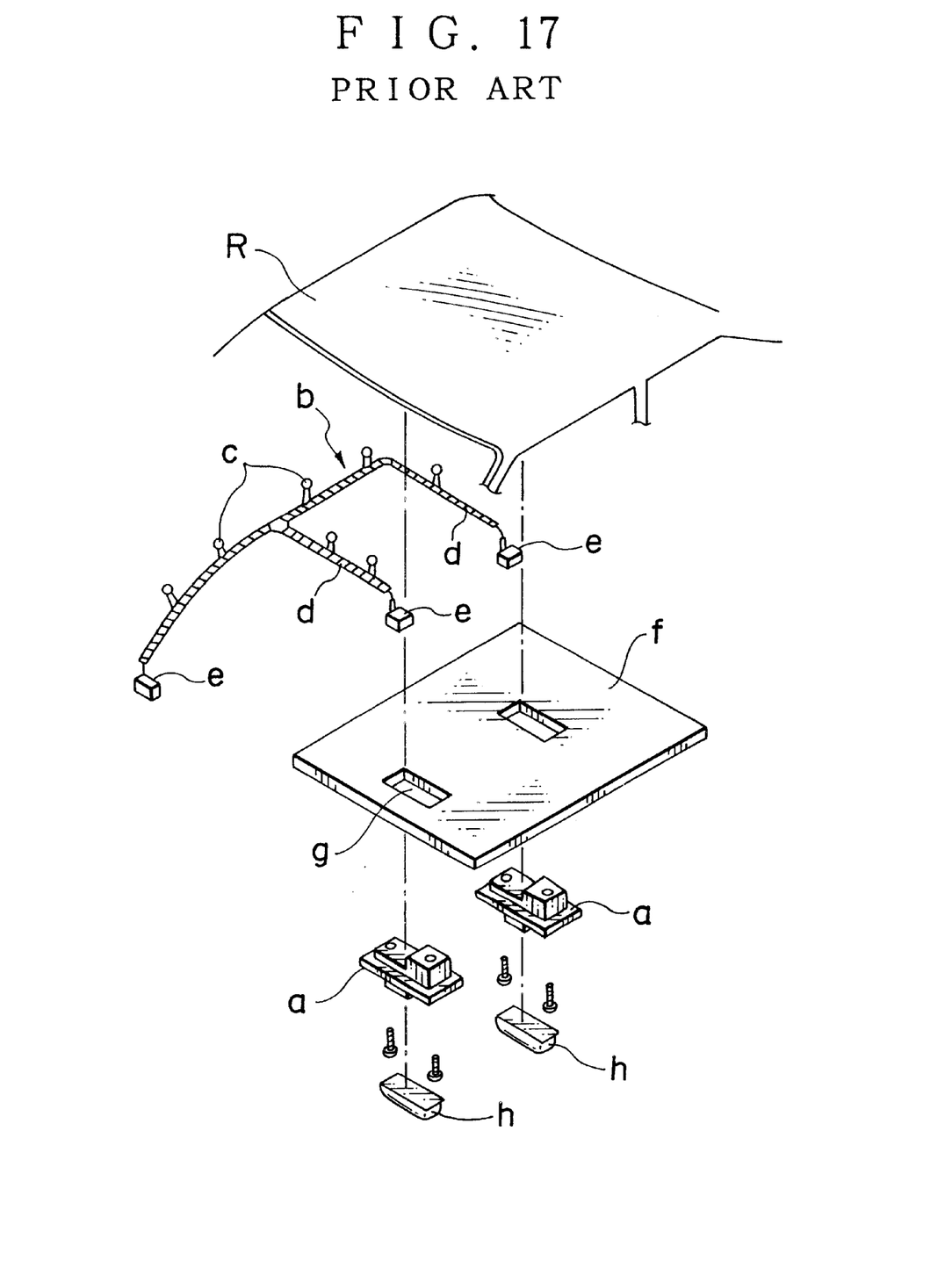
FIG. 17 is an exploded perspective view of the electric component and roof wiring harness of FIG. 16.

The conventional roof wiring harness b, as shown in FIG. 17, consists of a plurality of electric wires bundled with a tape and provided with branches d, a plurality of clamps c for fixing the wiring harness, and connectors e attached at ends of the branches d, the connectors being coupled to connectors (not shown) of the lighting unit a and to a connector at the end of a vehicle body side wiring harness.

To assemble the roof wiring harness b to the ceiling R, the former is first fixed to the latter with the clamps c, followed by mounting a molded ceiling f. The molded ceiling f has a plurality of mounting holes g through which the connectors e are passed in advance. After the connectors e are connected to the lighting units a, the lighting units a are fixed tough the mounting holes g to the vehicle body with bolts and covered with lamp covers h.

The assembling of the roof wiring harness b thus requires many steps, and especially the fixing by means of the clamps c—which need to be provided at many positions for preventing noises due to vibration—requires troublesome work and many manhours, resulting in a hinder to the improvement in productivity.

Figure 18:
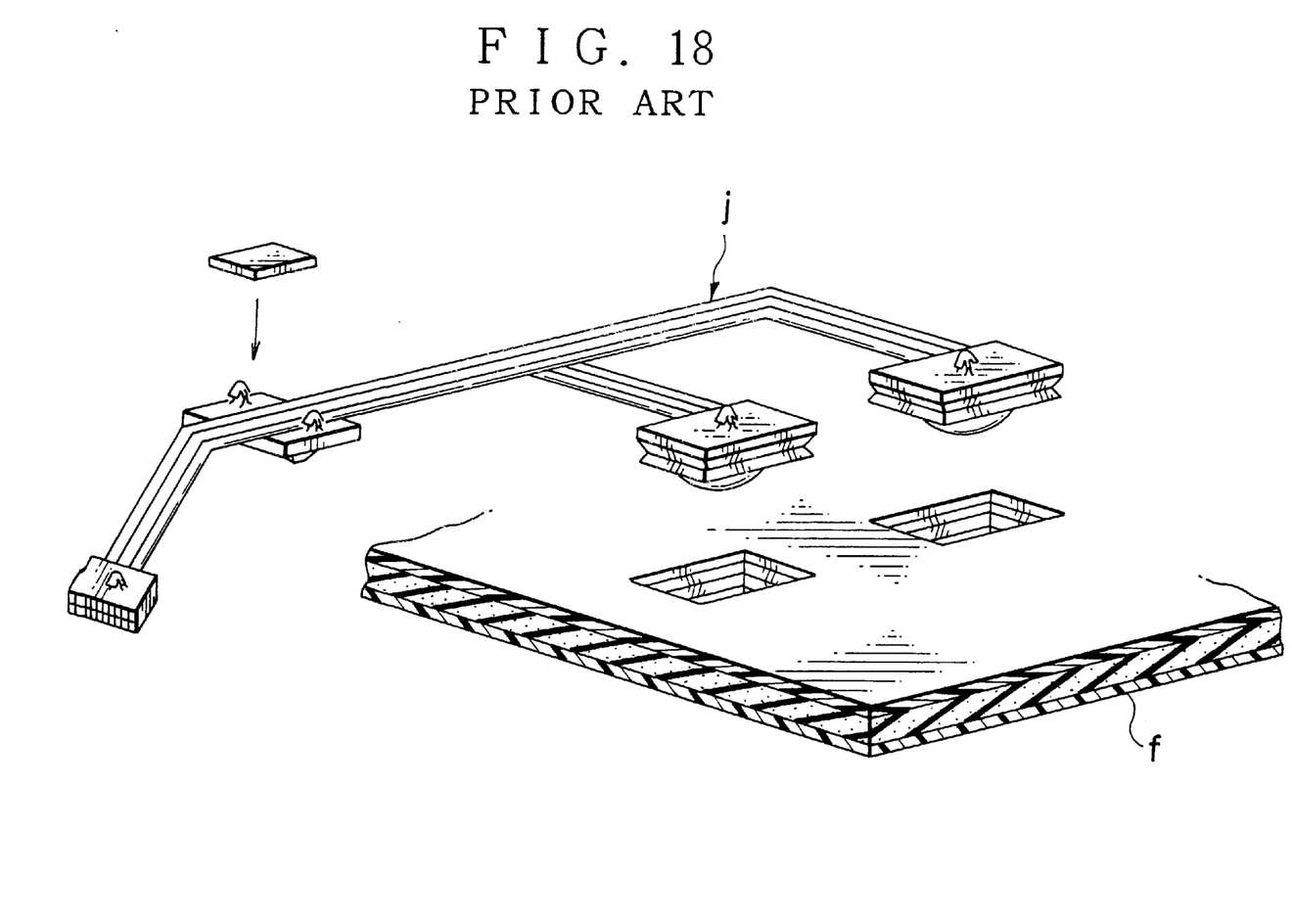
FIG. 18 is a perspective view of a flat wiring harness applied to a conventional automobile molded ceiling.

Under such conditions, a proposal is made in Japanese Patent Application Laid-Open Specification No. Hei 2-124344 according to which, as shown in FIG. 18, a flat wiring harness j with a flat wiring pattern is mounted on a molded ceiling f to simplify the electric wiring at the ceiling of a vehicle.

Figure 19:
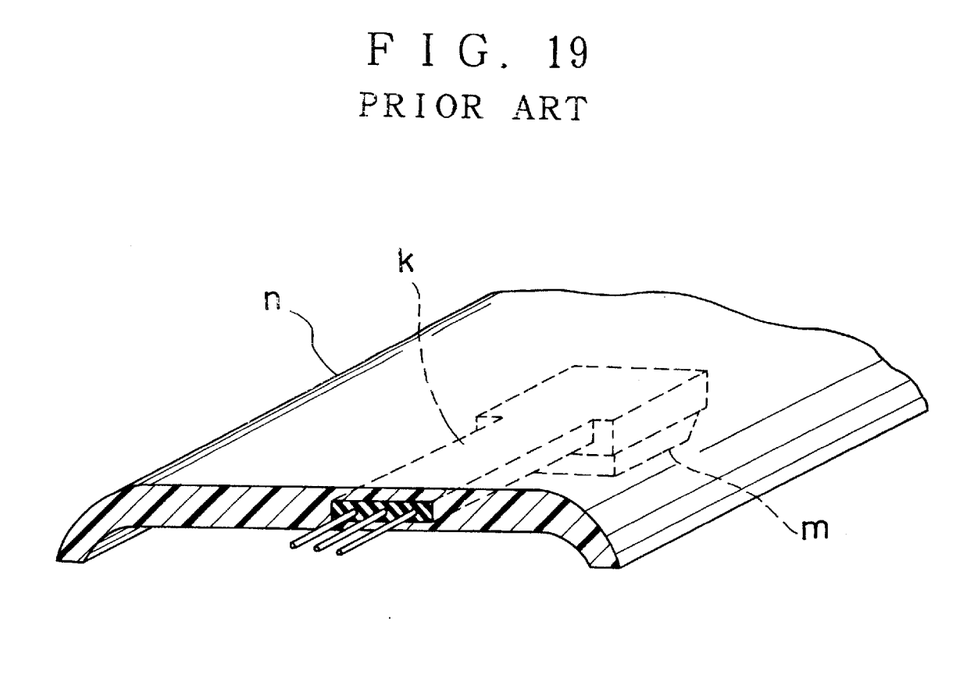
FIG. 19 is a perspective view of a conventional molded ceiling assembly having a roof wiring harness and an electric component integrally molded therein.

Further, another proposal is made in Japanese patent Application Laid-Open Specification No. Hei 2-124345 according to which, as shown in FIG. 19, a molded ceiling assembly n is provided, with a roof wiring harness k and an electric component m attached to an end of the harness integrally molded and fixed therein, and the molded ceiling assembly n is assembled on a vehicle body.

With the flat wiring harness j as shown in FIG. 18, however, in case different kinds of electric components are mounted on the molded ceiling f, many kinds of flat wiring harnesses j need to be correspondingly provided, adversely resulting in an increase in the number of parts and troublesome management thereof. Likewise, with the molded ceiling assembly n as shown in FIG. 19, in case different kinds of electric components are mounted, many kinds of molded ceiling assemblies n need to be prepared and stored, adversely resulting in troublesome management and in a hinder to the improvement in productivity as a whole.

SUMMARY OF THE INVENTION

This invention has been accomplished to overcome the above drawbacks and an object of this invention is to provide a ceiling-mounted electric component assembly which simplifies the assembling operation of electric components to the ceiling of a vehicle body, which enables many kinds of electric components to be optionally mounted, and which has a good adaptability to different types of vehicles.

In order to attain the object, according to this invention, there is provided a ceiling-mounted electric component assembly which comprises: a molded ceiling provided with an aperture for mounting therein an electric component, which is fastened to a ceiling of a vehicle body; a plurality of conductors extending across the electric component mounting aperture; a circuit body receiver plate provided to cover the electric component mounting aperture; an electric component which is mounted on the circuit body receiver plate, with the conductors located between the electric component and the circuit body receiver plate such that the electric component is electrically connected to at least one of the conductors; a switch for closing and opening an electric circuit for the electric component; and an additional circuit body optionally mountable on the circuit body receiver plate, which, when mounted on the receiver plate, is connected to a related one of the conductors.

Advantageously, the circuit body receiver plate is provided with an elongated hole, and the electric component comprises a connecting portion insertable into the elongated hole, locking projections provided on a periphery of the connecting portion, and electric contacts, and when the connecting portion is inserted into the elongated hole and rotated therein, the locking projections engage with side edges of the elongated hole to lock the electric component in position and bring the electric contacts into contact with two of the conductors.

Advantageously, one of the two conductors in contact with the electric contacts has a disconnected portion, and the switch is movable parallel to the one conductor to bridge the disconnected portion when operated.

Advantageously, the circuit body receiver plate has opposed guide grooves, and the additional circuit body has guide projections slidingly engageable in the opposed guide grooves to mount the additional circuit body in position on the circuit body receiver plate, and has a terminal attached to a circuit provided on the additional circuit body, through which the additional circuit body is connected to the related one of the conductors when the additional circuit body is mounted on the circuit body receiver plate.

Advantageously, the conductors are flat conductors of rectangular cross section arranged in a row and covered with insulating material to provide a flexible flat cable.

Advantageously, the electric component is a lamp, the ceiling-mounted electric component assembly further comprises a reflector plate on which the lamp is mounted in electric connection therewith, the lamp having an elastic contact piece, and a casing for mounting therein the reflector plate, the casing is assembled to the circuit body receiver plate to bring a contact of the lamp and the elastic contact piece into contact with two of the conductors.

Advantageously, the two conductors in contact with the contact of the lamp and the elastic contact piece are conductors located on opposite sides of an intermediate conductor.

Advantageously, the switch has a contact contactable with one of the two conductors and the intermediate conductor at a time when the switch is operated, the intermediate conductor being connected to a power source.

Advantageously, the electric component is a lamp, the ceiling-mounted electric component assembly further comprises a reflector plate on which the lamp is mounted in electric connection therewith, the lamp having an elastic contact piece, and the reflector plate s mounted on the circuit body receiver plate to bring a contact of the lamp and the elastic contact piece into contact with two of the conductors.

Advantageously, the ceiling-mounted electric component assembly further comprises a connector provided at an end of the conductors for connecting to an external circuit.

The above and other objects, features and advantages of this invention will become apparent from the following description and the appended claims, taken in conjunction with the accompanying drawings.

DESCRIPTION OF THE PREFERRED EMBODIMENTS

Embodiments of this invention will now be described with reference to the attached drawings.

Figure 1:
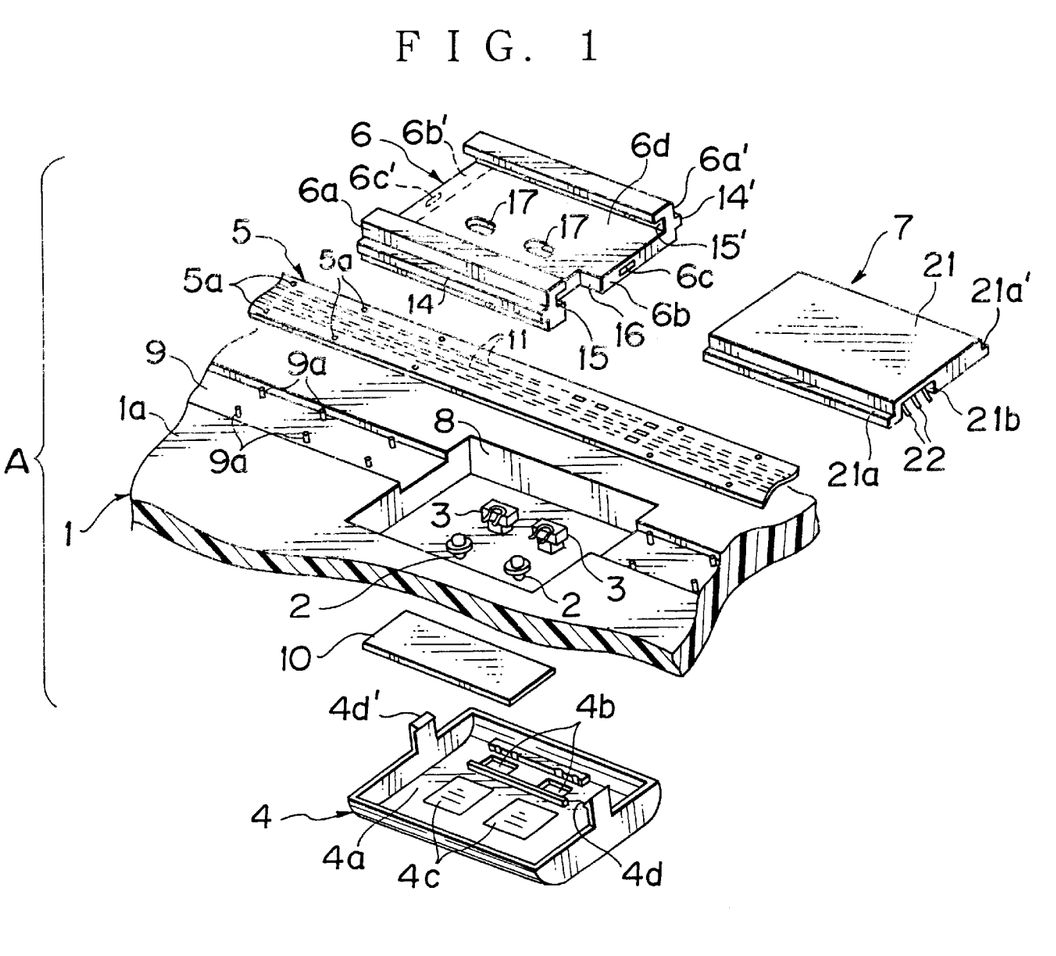
FIG. 1 is an exploded perspective view of a ceiling-mounted electric component assembly according to one embodiment of this invention.

FIG. 1 is an exploded perspective view of a ceiling-mounted electric component assembly A according to one embodiment of this invention.

The ceiling-mounted electric component assembly A consists of a molded ceiling 1 which is fastened to the underside of an automobile ceiling, electric components such as lamps 2 and switches 3 which are mounted on the molded ceiling 1, a lamp casing 4 for receiving the electric components, a flexible flat cable 5 for electrically connecting the electric components to an external circuit, a circuit body receiver plate 6 which is mounted on the molded ceiling 1 and supports the lamp casing 4, and an additional circuit body 7 which is optionally installed on the circuit body receiver plate 6.

The molded ceiling 1 is at a substantially central portion thereof provided with an electric component mounting aperture 8 where the lamp casing 4—which receives the lamps 2 and switches 3—and the circuit body receiver plate 6 are mounted. On the top wall 1a of the molded ceiling 1 is formed a cable receiving groove 9 for receipt therein of the flat cable 5. A plurality of projections 9a are arranged in lines at opposite sides of the cable receiving groove 9.

The lamp casing 4, which is made of synthetic resin into a shallow box-like form, has in its bottom wall 4a openings 4b through which the switches 3 are operated and lenses 4c for the lamps 2, and at its longitudinally opposite ends locking claws 4d, 4d'. The lamp casing 4 is joined to the circuit body receiver plate 6, with the lamps 2, the switches 3 and a reflector plate 10 received in the lamp casing 4, through the engagement of the locking claws 4d, 4d' in later-described locking recesses 6c, 6c' provided on the circuit body receiver plate 6.

Figure 2:
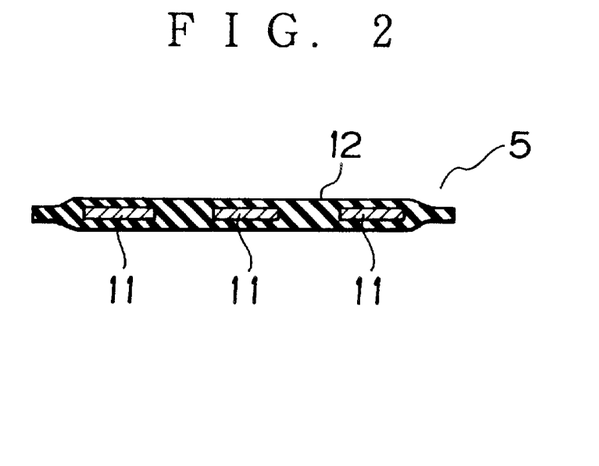
FIG. 2 is a sectional view of a flexible flat cable in FIG. 1.

The flat cable 5, as shown in FIG. 2, is of tape-like form and consists of a plurality of flat conductors 11 (three in the present example) of rectangular cross section arranged in a row and sealingly held in an insulating cover 12 constituted by electrically insulating films of synthetic resin.

Figure 6:
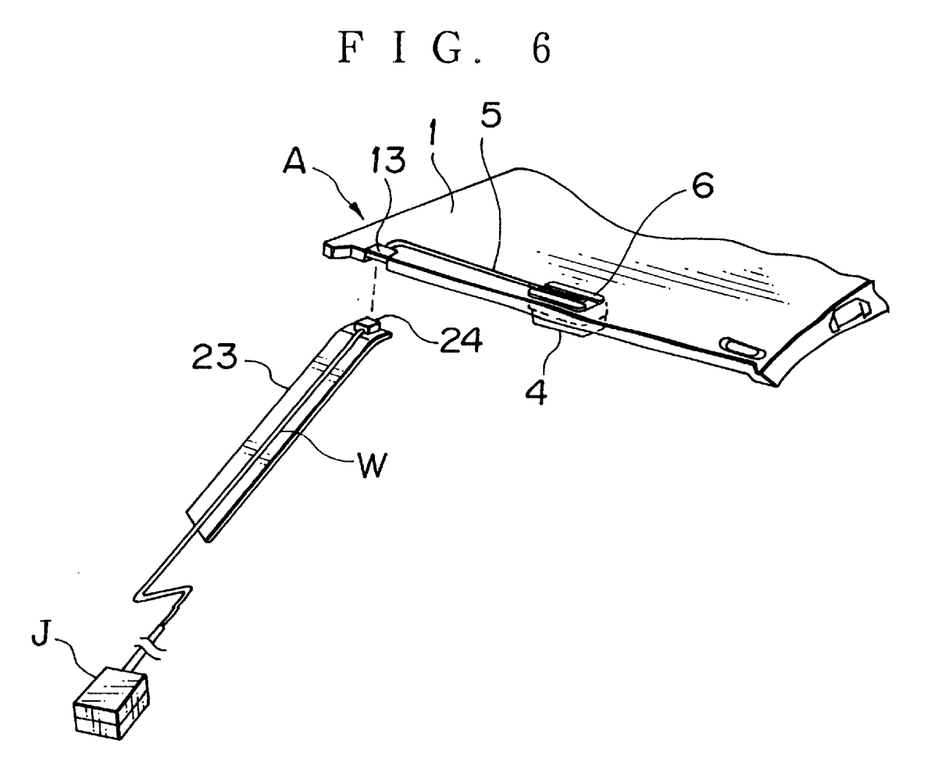
FIG. 6 is an explanatory view showing the ceiling-mounted electric component assembly of FIG. 1 about to be mounted on a vehicle body.

The flat cable 5 is received in the cable receiving groove 9 on the molded ceiling 1 to cross the electric component mounting aperture 8, with fixing holes 5a provided along its edges fitted over the projections 9a provided in the cable receiving groove 9. The projections 9a are fused to fix the flat cable 5 in position. The flat cable 5 is at an end thereof attached with a connector 13 for connection to a circuit on the vehicle body side (FIG. 6).

The circuit body receiver plate 6 is mounted on the molded ceiling 1 to entirely cover the mounting aperture 8. Opposite lateral walls 6a, 6a' of the circuit body receiver plate 6 have locking projections 14, 14' at outer sides thereof and guide grooves 15, 15' at inner sides thereof. Longitudinally opposite end walls 6b, 6b' of the circuit body receiver plate 6 are provided with respective locking recesses 6c, 6c', and one of the end walls 6b is further provided with a cutout 16 through which a connection is made between the additional circuit body 7 and the flat cable 5 when the former is installed on the circuit body receiver plate 6.

Figure 3:
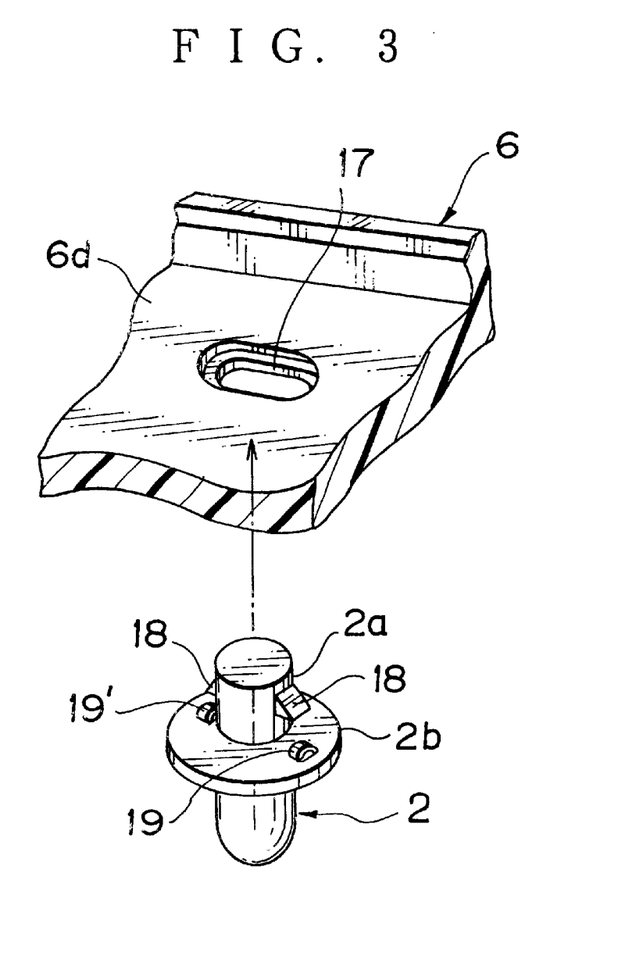
FIG. 3 is a perspective view of a structure for mounting a lamp in a circuit body receiver plate in FIG. 1.
Figure 4:
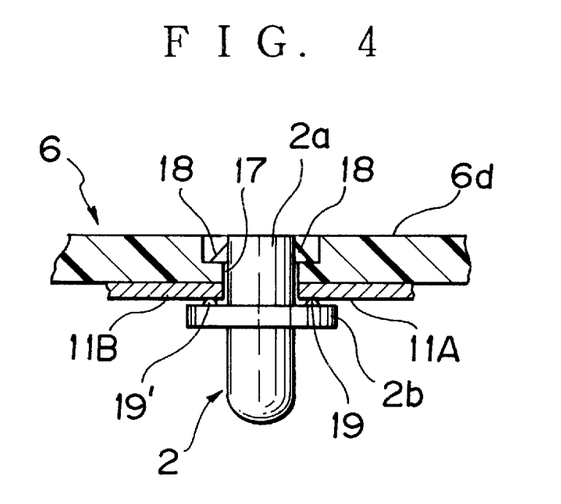
FIG. 4 is a sectional view showing the lamp of FIG. 3 mounted in the circuit body receiver plate.

The circuit body receiver plate 6, as shown in FIG. 3, has lamp mounting elongated holes 17 in its bottom wall 6d. Each lamp 2 has a connecting portion 2a, locking projections 18 on the connecting portion 2a, a flange 2b, and contacts 19, 19' on the flange 2b which lead to an illuminant inside the lamp 2. The connecting portion 2a of each lamp 2 is inserted into the related elongated hole 17 and turned by about 90° so that the locking projections 18 and the flange 2b pressingly hold the circuit body receiver plate 6 and thus the flat cable 5 therebetween to fix the lamp in position and to connect the lamp contacts 19, 19' to the respective flat conductors 11A and 11B of the flat cable 5.

Figure 5:
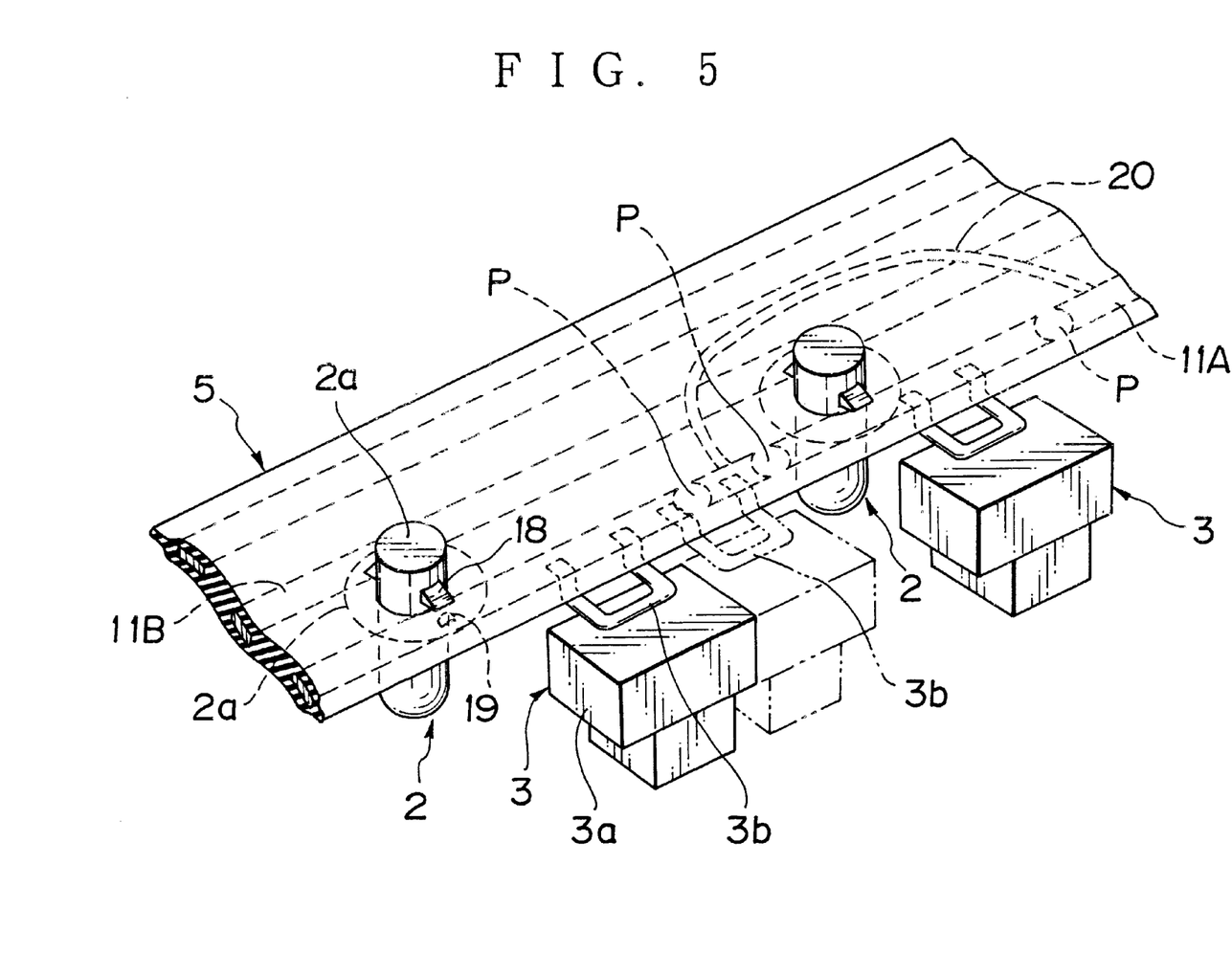
FIG. 5 is an explanatory view of the lamps and the switches of FIG. 1, shown in connection with each other.

As shown in FIG. 5, one of the three flat cables 11A of the flat cable 5 is at predetermined positions P cut with a punch or the like, and connections are made through elastic connecting pieces 3b provided on the switches 3 to form an on/off circuit for the lamps 2. A jumper wire 20 forms a branch circuit to the cut circuit of the flat conductor 11A to light both the two lamps 2.

The elastic connecting piece 3b is provided in U-like form on a main body 3a of the switch 3 which is moved parallel to the flat cable 5 inside the opening 4b of the lamp casing 4 (between the positions in solid and dotted lines in FIG. 5) so that the circuit leading from a power source through the flat conductor 11A to one contact 19 of the lamp 2 is opened and closed via the elastic connecting piece 3b.

The additional circuit body 7 consists of a box-like casing 21 and a circuit substrate (not shown) contained in the box-like casing, which functions to drive additional devices such as a dazzle prevention mirror, sunroof and the like. The box-like casing 21 is at opposite lateral walls thereof provided with guide projections 21a, 21a' which are slided into the guide grooves 15, 15' of the circuit body receiver plate 6 to removably install the additional circuit body 7 on the circuit body receiver plate 6.

Thus, the additional circuit body 7 is optionally mountable only in a vehicle installed with additional functions due to its type and grade, and need not be mounted in a vehicle of a popular type whose ceiling is provided only with the lamps 2 and the switches 3 as the electric components.

The connection between an internal circuit of the additional circuit body 7 and the flat cable 5 is made by joining contact terminals 22—which lead from the additional circuit body internal circuit and are exposed through an opening 21b provided at one end of the additional circuit body 7—to exposed portions of the respective flat conductors 11 where the insulating cover 12 has been removed. A circuit similar to that based on the combination of lamps 2 and switches 3 may be added to operate the internal circuit of the additional circuit body 7, and if needed the number of flat conductors 11 inside the flat cable 5 may be increased.

The lamp casing 4 is assembled in the following procedure. The circuit body receiver plate 6 is mounted in the mounting aperture 8. The lamp 2, after insertion of its connecting portion 2a into the elongated hole 17 of the circuit body receiver plate 6, is turned about 90° to be mounted. Thereafter, the main body 3a of the switch 3 is arranged in the opening 4b, and then the lamp casing 4, with the reflector plate 10 added, is positioned relative to the circuit body receiver plate 6, followed by engaging the locking claws 4d, 4d' of the lamp casing 4 in the locking recesses 6c, 6c' of the circuit body receiver plate 6 to lock the lamp casing 4 and the circuit body receiver plate 6 together.

The thus constructed ceiling-mounted electric component assembly A is mounted on the ceiling of a vehicle body, and as shown in FIG. 6 the connector 13 at the end of the flat cable 5 is coupled to a connector 24 of a wiring harness W laid on a pillar 23 of the vehicle body so that via the pillar wiring harness W, the lamps 2, the switches 3 and the optionally mounted additional circuit body 7 are connected to an electric junction box J in the vehicle body.

Figure 7:
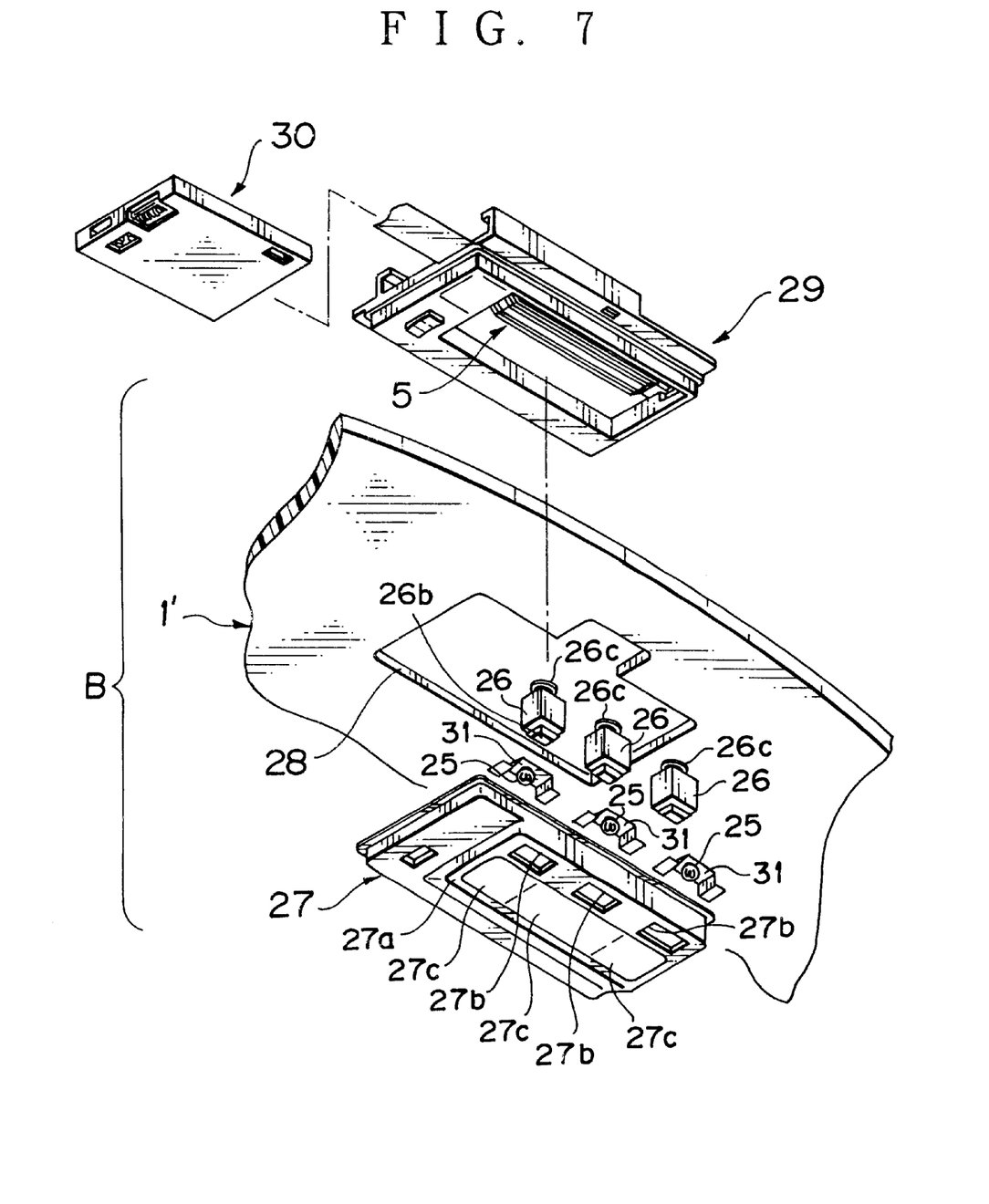
FIG. 7 is an exploded perspective view of a ceiling-mounted electric component assembly according to another embodiment of this invention.

FIG. 7 is an exploded perspective view of a ceiling-mounted electric component assembly B according to another embodiment of this invention.

The ceiling-mounted electric component assembly B consists of a molded ceiling 1' which is fastened to the underside of an automobile ceiling, electric components such as lamps 25 and switches 26 which are mounted on the molded ceiling 1', a lamp casing 27 for receiving the electric components, the same flexible flat cable 5 as in the preceding example, a circuit body receiver plate 29 which is mounted to cover an electric component mounting aperture 28 provided in the molded ceiling 1', and an additional circuit body 30 which is optionally installed on the circuit body receiver plate 29.

The ceiling-mounted electric component assembly B differs from the preceding electric component assembly A in the structure for mounting the lamps 25 and reflector plates 31 in the lamp casing 27 and is substantially the same in other structures as the electric component assembly A. Thus, the mounting structure of the lamps 25 and the reflector plates 31 will be described below, with description of other structures being omitted.

Figure 8:
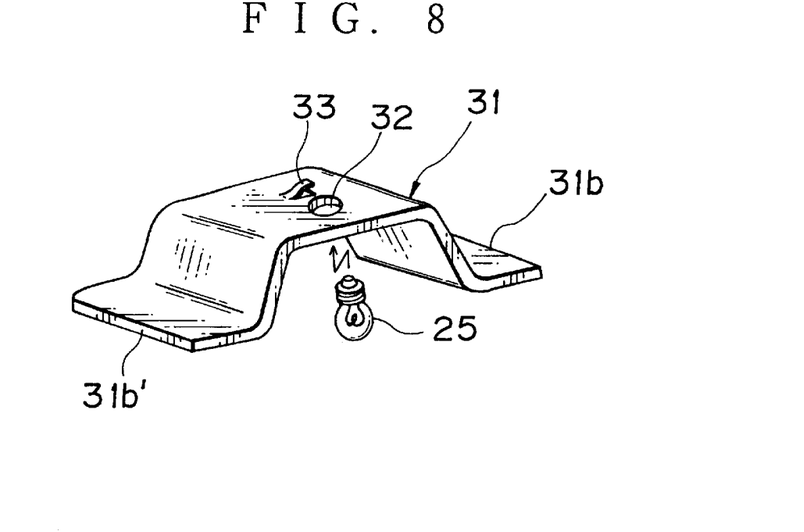
FIG. 8 is a perspective view of a lamp and a reflector plate in FIG. 7.

Each reflector plate 31 is formed by bending a thin metallic plate and, as shown in FIG. 8, has a lamp socket hole 32 at a central portion thereof into which the related lamp 25 is fitted and supported, and an elastic contact 33 formed by cutting and raising the reflector plate 31 at a position near the lamp socket hole 32.

Figure 9:
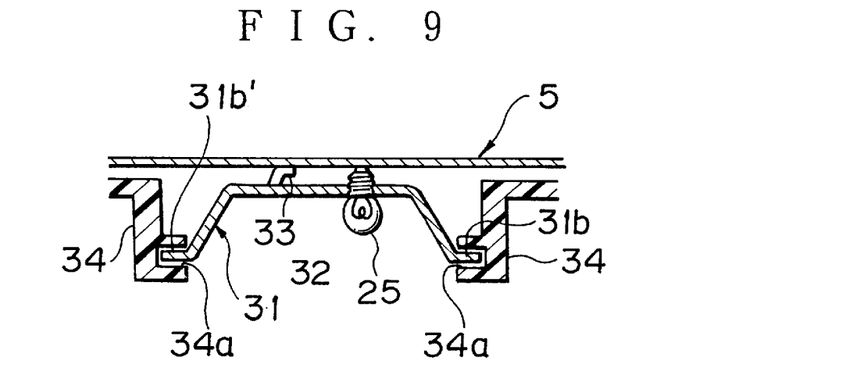
FIG. 9 is a sectional view of the reflector plate of FIG. 8 mounted on a lamp casing.

On an outer wall 27a of the lamp casing 27, there are provided a plurality of openings 27b for the switches 26 and a plurality of lenses 27c (respectively three in the present example). On an inner side of each lens 27c, as shown in FIG. 9, support walls 34 are provided upright which have opposed mounting grooves 34a for insertion therein of opposite ends 31b, 31b' of the related reflector plate 31. The reflector plate 31 is thus fixed in position.

Figure 10:
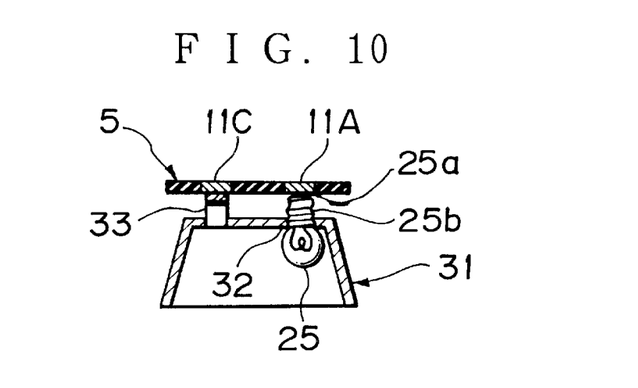
FIG. 10 is a sectional view showing the lamp and the reflector plate of FIG. 8 in connection with flat conductors of a flexible flat cable.

In the condition where the lamp casing 27 is assembled to the circuit body receiver plate 29, as shown in FIG. 10, the plus side electrode 25a of the lamp 25 and the elastic contact piece 33 are in contact with respective flat conductors 11A and 11C at predetermined positions where the flat cable insulating cover 12 has been removed.

Figure 11:
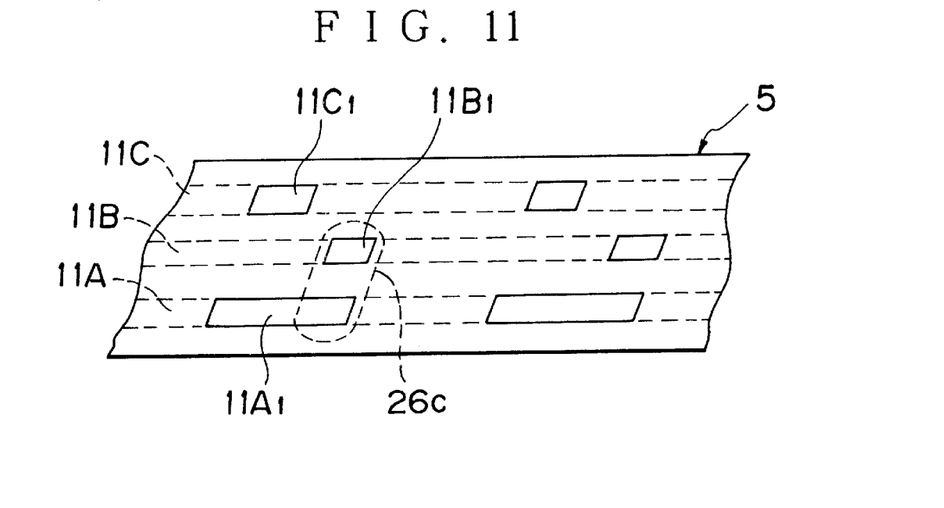
FIG. 11 is an explanatory view of a connecting structure between the flat conductors of the flat cable of FIG. 7 and a switch.

The flat conductor 11A, as shown in FIG. 11, is exposed at predetermined positions to provide conductor-exposed portions 11A1 through which the flat conductor 11A is connected to the plus side electrodes 25a of the lamps 25, and through which the flat conductor 11A is connected to the flat conductor 11B by means of the switches 26 when the switches are put on. That is, the contact 26c of the switch 26 contacts the conductor-exposed portion 11A1 and a corresponding conductor-exposed portion 11B1 at a time when the switch 26 is put on. The minus side electrode 25b of the lamp 25 is fitted into the lamp socket hole 32 to electrically connect to the reflector plate 31 and to a related conductor-exposed portion 11C1 of the flat conductor 11C.

The flat conductor 11B is connected to a plus side power source, and thus the lamp 25 is connected through the switch 26 to the flat conductor 11B and to the flat conductor 11C and may be put on and off through the operation of the switch 26.

The switch 26 is of a push type and has an operating portion 26b which is pressed to put the contact 26c into and out of contact with the conductors 11A and 11B, and is received in the opening 27b of the lamp casing 27 with its operating portion 26b projected.

Figure 12:
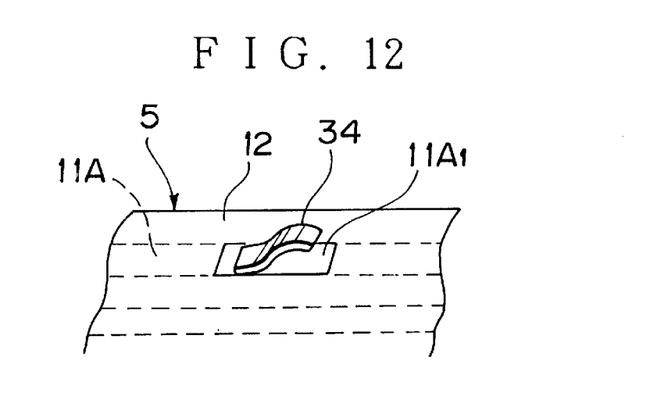
FIG. 12 is a perspective view showing a plate spring welded to a flat conductor of the flat cable of FIG. 11.

As shown in FIG. 12, a plate spring 34 may be provided through welding on the conductor-exposed portion 11A1 of the flat conductor 11A to make a reliability-improved connection between the plus side electrode 25a of the lamp 25 and the conductor 11A.

Figure 13:
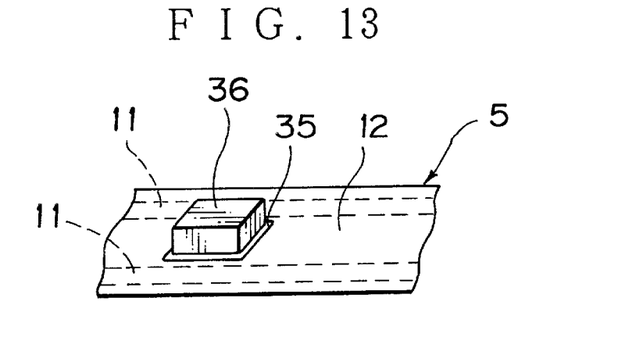
FIG. 13 is a perspective view showing a support projection projecting through an opening provided in the insulating cover of the flat cable of FIG. 11.

Further, as shown in FIG. 13, the insulating cover 12 of the flat cable 5 may be provided with a hole 35, and the circuit body receiver plate 29 with a support projection 36 which is put into the hole 35 to project therefrom. This makes it possible to adjust the height of the reflector plate 31 and do the positioning of the flat cable 5.

Figure 14:
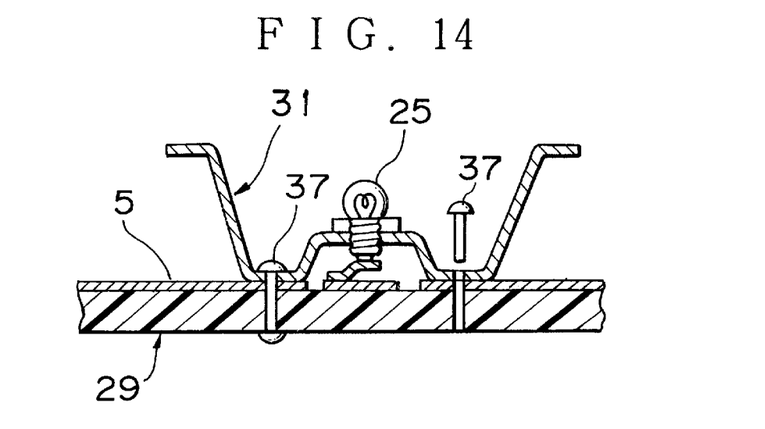
FIG. 14 is a sectional view of the reflector plate mounted on the circuit body receiver plate of FIG. 7.
Figure 15:
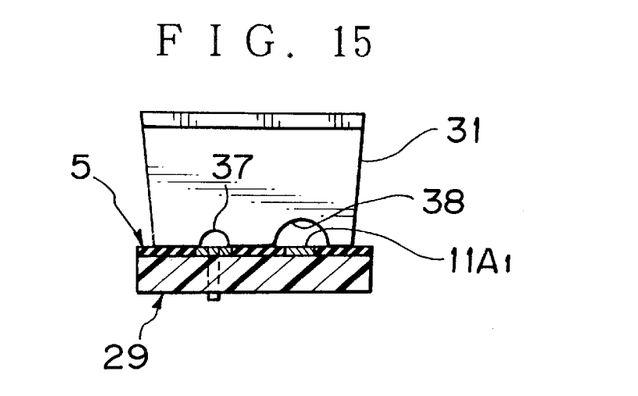
FIG. 15 is a side view of the reflector plate of FIG. 14 on the flat cable.

While in the above example, the reflector plate 31 is shown to be mounted on the lamp casing 27, it is also possible, as shown in FIG. 14, to fix the reflector plate 31 to the circuit body receiver plate 29 with rivets 37. In this case, as shown in FIG. 15, the reflector plate 31 is preferably provided with a cutout 38 to stride across and prevent the contact with the conductor-exposed portion 11A1 of the flat cable 11A to which the plus side electrode 25a of the lamp 25 is connected.

Thus, in the ceiling-mounted electric component assembly B, the lamps 25 and the related reflector plates 31 are mounted in advance in combined condition in the lamp casing 27 or on the circuit body receiver plate 29. Hence, in either case, the assembling of the lamp casing 27 to the circuit body receiver plate 29 enables the electric components inside the lamp casing 27 to be installed, resulting in a simplified mounting operation at the ceiling of a vehicle body.

Advantages of this invention may be summarized as follows. Because, in the ceiling-mounted electric component assembly of this invention, electric components and their wiring conductors in the form of a wiring harness are integrally mounted on the molded ceiling, the mounting operation of the electric components on a vehicle body is greatly improved. Further, because the circuit body receiver plate is provided on which an additional circuit body is optionally installable, the electric component assembly of this invention is easily applicable to a vehicle of a type which carries additional electric components in addition to fundamental ones, advantageously resulting in a reduction in the number of parts and easily performable modifications of functions.

Having now fully described the invention, it will be apparent to one of ordinary skill in the art that many changes and modifications can be made thereto without departing from the spirit and scope of the invention as set forth herein.

What is claimed is:

1. A ceiling-mounted electric component assembly comprising:

a molded ceiling provided with an aperture for mounting therein an electric component, which is fastened to a ceiling of a vehicle body;

a plurality of conductors extending across said electric component mounting aperture;

a circuit body receiver plate provided to cover said electric component mounting aperture;

a said electric component is mounted on said circuit body receiver plate, with said conductors positioned between said electric component and said circuit body receiver plate such that said electric component is electrically connected to at least one of said conductors;

a switch for closing and opening an electric circuit for said electric component; and an additional circuit body optionally mountable on said circuit body receiver plate, which, when mounted on said receiver plate, is connected to a related one of said conductors.

2. The ceiling-mounted electric component assembly according to claim 1, wherein said circuit body receiver plate is provided with an elongated hole, and said electric component comprises a connecting portion insertable into said elongated hole, locking projections provided on a periphery of said connecting portion, and electric contacts, and wherein when said connecting portion is inserted into said elongated hole and rotated therein, said locking projections engage with side edges of said elongated hole to lock said electric component in position and bring said electric contacts into contact with two of said conductors.

3. The ceiling-mounted electric component assembly according to claim 2, wherein one of said two conductors in contact with said electric contacts has a disconnected portion, and said switch is movable parallel to said one conductor to bridge said disconnected portion when operated.

4. The ceiling-mounted electric component assembly according to claim 1, wherein said circuit body receiver plate has opposed guide grooves, and said additional circuit body has guide projections slidingly engageable in said opposed guide grooves to mount said additional circuit body in position on said circuit body receiver plate, and has a terminal attached to a circuit provided on said additional circuit body, through which said additional circuit body is connected to said related one of said conductors when said additional circuit body is mounted on said circuit body receiver plate.

5. The ceiling-mounted electric component assembly according to claim 1, wherein said conductors are flat conductors of rectangular cross section arranged in a row and covered with insulating material to provide a flexible flat cable.

6. The ceiling-mounted electric component assembly according to claim 1, wherein said electric component is a lamp, further comprising a reflector plate on which said lamp is mounted in electric connection therewith, said reflector plate having an elastic contact piece, and a casing for mounting therein said reflector plate, said casing is assembled to said circuit body receiver plate to bring a contact of said lamp and said elastic contact piece into contact with two of said conductors.

7. The ceiling-mounted electric component assembly according to claim 6, wherein said two conductors in contact with said contact of said lamp and said elastic contact piece are conductors located on opposite sides of an intermediate conductor.

8. The ceiling-mounted electric component assembly according to claim 7, wherein said switch has a contact contactable with one of said two conductors and said intermediate conductor at a time when said switch is operated, said intermediate conductor being connected to a power source.

9. The ceiling-mounted electric component assembly according to claim 1, wherein said electric component is a lamp, further comprising a reflector plate on which said lamp is mounted in electric connection therewith, said reflector plate having an elastic contact piece, and wherein said reflector plate is mounted on said circuit body receiver plate to bring a contact of said lamp and said elastic contact piece into contact with two of said conductors.

10. The ceiling-mounted electric component assembly according to claim 1, further comprising a connector provided at an end of said conductors for connecting to an external circuit.

* * * * *